(12) United States Patent
Sudo

(10) Patent No.: US 8,452,913 B2
(45) Date of Patent: May 28, 2013

(54) SEMICONDUCTOR MEMORY DEVICE AND METHOD OF PROCESSING DATA FOR ERASE OPERATION OF SEMICONDUCTOR MEMORY DEVICE

(75) Inventor: Naoaki Sudo, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 243 days.

(21) Appl. No.: 12/909,060

(22) Filed: Oct. 21, 2010

(65) Prior Publication Data
US 2011/0145483 A1 Jun. 16, 2011

(30) Foreign Application Priority Data

Dec. 16, 2009 (JP) ................................ 2009-285546
Mar. 25, 2010 (KR) ........................ 10-2010-0026899

(51) Int. Cl.
*G06F 12/00* (2006.01)

(52) U.S. Cl.
USPC ........... 711/103; 711/100; 711/156; 711/167; 711/E12.001; 711/E12.008

(58) Field of Classification Search
USPC .......... 711/100, 103, 154, 156, 167, E12.001, 711/E12.008
See application file for complete search history.

(56) References Cited

U.S. PATENT DOCUMENTS

2006/0002197 A1* 1/2006 Rudelic .................... 365/189.09
2010/0115186 A1* 5/2010 Chang et al. .................. 711/103

FOREIGN PATENT DOCUMENTS

JP 2001312891 A 11/2001

* cited by examiner

*Primary Examiner* — Jasmine Song
(74) *Attorney, Agent, or Firm* — Volentine & Whitt, PLLC

(57) ABSTRACT

A semiconductor memory device including a plurality of memory blocks, and an erase flag storage block storing erase flag information to indicate erase states of the plurality of memory blocks. The erase flag information can be used to monitor completion of erase operations of the memory blocks and to update erase count information of the memory blocks.

19 Claims, 5 Drawing Sheets

SEMICONDUCTOR MEMORY DEVICE AND METHOD OF PROCESSING DATA FOR ERASE OPERATION OF SEMICONDUCTOR MEMORY DEVICE

CROSS-REFERENCE TO RELATED APPLICATIONS

This application claims priority under 35 U.S.C. §119 to Korean Patent Application No. 10-2010-0026899 filed on Mar. 25, 2010, and Japanese Patent Application No. 2009-285546 filed on Dec. 16, 2009, the respective disclosures of which are hereby incorporated by reference in their entirety.

BACKGROUND

Embodiments of the inventive concept relate generally to electronic memory technologies. More particularly, embodiments of the inventive concept relate to semiconductor memory devices and related methods of processing data for erase operations.

Nonvolatile memory is a type of memory that retains stored data when disconnected from power. One popular form of nonvolatile memory is flash memory, which can be found in a wide range of modern electronic devices, such as computers, portable memory drives, home electronics, cellular phones, and digital cameras, to name but a few.

Unlike some other forms of memory, flash memory cannot be rewritten without first performing an erase operation. In other words, before new data can be written to a memory cell of a flash memory device, any old data must be erased from the memory cell. Each block of a flash memory is limited in the number of erase operations that it can undergo before it wears out. This limitation, referred to as erase endurance, tends to vary between different flash memories. As an example, many flash memories have an erase endurance of ten thousand to one million erase cycles.

Once a memory block wears out, at least some of its memory cells can no longer reliably store data. Accordingly, to avoid errors that can arise from unreliable memory blocks, flash memories often maintain an erase count for each memory block to ensure that the memory blocks are not erased beyond their erase endurance. The erase count can also be used to perform wear leveling, which aims to control the distribution of erase operations among different memory blocks. In other words, wear leveling is used to prevent different memory blocks from wearing out at significantly different rates.

SUMMARY

According to an embodiment of the inventive concept, a semiconductor memory device comprises a plurality of memory blocks arranged in a single chip. The semiconductor memory device comprises a wear leveling unit that stores management information comprising an erase count of one or more of the plurality of memory blocks, an information storage unit that stores address information of a selected memory block among the plurality of memory blocks, and further stores an erase flag indicating whether an erase operation of the selected memory block has been initiated or completed. The semiconductor memory device further comprises a setting unit that sets the address information of the selected memory block in the information storage unit upon initiation of the erase operation, sets the erase flag to a first value upon initiation of the erase operation, and sets the erase flag to a second value upon completion of the erase operation. The semiconductor memory device still further comprise a determination unit that determines whether the erase operation has been completed based on erase flag information stored in the information storage unit.

In certain embodiments, the setting unit sets the erase flag to the first value by programming a single bit of the information storage unit.

In certain embodiments, before the erase operation of the selected memory block, the determination unit determines whether all previously initiated erase operations of the plurality of memory blocks have been completed, based on the erase flag information.

In certain embodiments, following a power loss and a subsequent power restoration of the semiconductor memory device, the determination unit determines whether erase operations of the memory blocks that were initiated before the power loss have been completed, based on the erase flag information.

In certain embodiments, the erase flag of the selected memory block comprises two bits of data, wherein a first one of the two bits is programmed to indicate that an erase operation is being performed on the selected memory block, and a second one of the two bits is programmed to indicate that the erase operation of the selected memory block is completed.

In certain embodiments, the wear leveling unit, the information storage unit, the setting unit, and the determination unit are located in the single chip.

In certain embodiments, each of the plurality of memory blocks comprises a NAND flash memory block.

In certain embodiments, the information storage unit comprises a memory block of nonvolatile memory cells.

According to another embodiment of the inventive concept, a method is performed by a semiconductor memory device comprising a plurality of memory blocks, a wear leveling unit that stores erase counts of the memory blocks, and an erase flag storage block that stores block address information of the memory blocks and erase flag information indicating erase operation states of the memory blocks. The method comprises reading an erase flag from the erase flag storage block in response to an erase command, and determining whether any previously initiated erase operation remains incomplete, according to the erase flag. Upon determining that no previously initiated erase operation remains incomplete, the method performs (a) storing in the erase flag storage block an erase block address of a selected memory block to be erased, and programming an upper bit of the erase flag, (b) reading management information stored in a management region of the selected memory block to determine whether to perform address replacement on the selected memory block, (c) upon determining to perform address replacement on the selected memory block, generating address replacement information for the selected memory block, (d) performing an erase operation on the selected memory block according to the erase command, (e) generating a new management region for the selected memory block, (f) programming a lower bit of the erase flag following completion of the erase operation, and (g) obtaining information to identify any unused erase operation data regions of the erase flag storage block.

In certain embodiments, the method further comprises upon determining that a previously initiated erase operation remains incomplete, performing a restoration process on a memory block for which the erase operation was initiated.

In certain embodiments, the method further comprises programming a lower bit of the erase flag upon completing the restoration process.

In certain embodiments, the method further comprises designating a number of erase operation data regions for the erase flag storage block according to a number of memory blocks in the semiconductor memory device, and erase endurance parameters of the memory blocks.

In certain embodiments, the method further comprises performing an erase process of the erase flag storage block when there is no unused region of the erase flag storage block.

In certain embodiments, the erase flag storage block comprises a nonvolatile memory block located a single chip comprising the plurality of memory blocks, and wherein the erase flag storage block is programmed in different sized units than the plurality of memory blocks.

According to still another embodiment of the inventive concept, a semiconductor memory device comprises a plurality of memory blocks, an erase flag storage block storing block address information of the respective memory blocks, and flag information indicating erase operation states of the respective memory blocks, and a wear leveling unit storing management information on erase counts of the respective memory blocks and configured to control the management information for wear leveling operations of the memory blocks, wherein the flag information indicates whether the memory blocks are successfully erased during erase operations.

In certain embodiments, the memory blocks and the erase flag storage block are erased in different sized erase units.

In certain embodiments, the flag information comprises at least one bit indicating an input state of an erase instruction and at least one bit indicating a completion state of an erase operation corresponding to the erase instruction.

In certain embodiments, the device further comprises an erase flag determination circuit determining a use state of an erase operation data region in the erase flag storage block.

In certain embodiments, the erase flag determination circuit determines whether an erase operation of one of the memory blocks has been interrupted based on the use state.

In certain embodiments, the one of the memory blocks is re-erased upon determining that the erase operation has been interrupted.

BRIEF DESCRIPTION OF THE DRAWINGS

The drawings illustrate selected embodiments of the inventive concept. In the drawings like reference numbers indicate like features.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

In general, embodiments of the inventive concept relate to data management operations for erase operations of the nonvolatile memory devices. These data management operations can be used, for instance, to ensure that erase operations are performed properly, and that wear leveling is conducted in an accurate manner. Examples of the data management operations include address replacement operations for reassigning logical addresses of stored data based on memory block usage and erase operations, erase count management operations for determining the order in which memory blocks are erased, and merge operations for consolidating data from a memory block being erased into a new memory block.

Some of these data management operations used to ensure the reliability of stored data. For instance, erase count management is used to ensure that wear leveling is performed properly, and to ensure that memory blocks are not erased beyond their erase endurance. Accordingly, inaccurate tracking of erase operations can lead to errors in read or program operations of the memory blocks.

Certain data management operations can be impaired by a sudden loss of power during an erase operation of a selected memory block. For instance, such a loss of power can result in incomplete erasure of the selected memory block or inaccurate counting of the erase operation. A technology has been proposed to address this problem, as disclosed in Japanese Patent Application Laid-Open No. 2001-312891 (hereinafter, Japanese '891).

Figure 5:
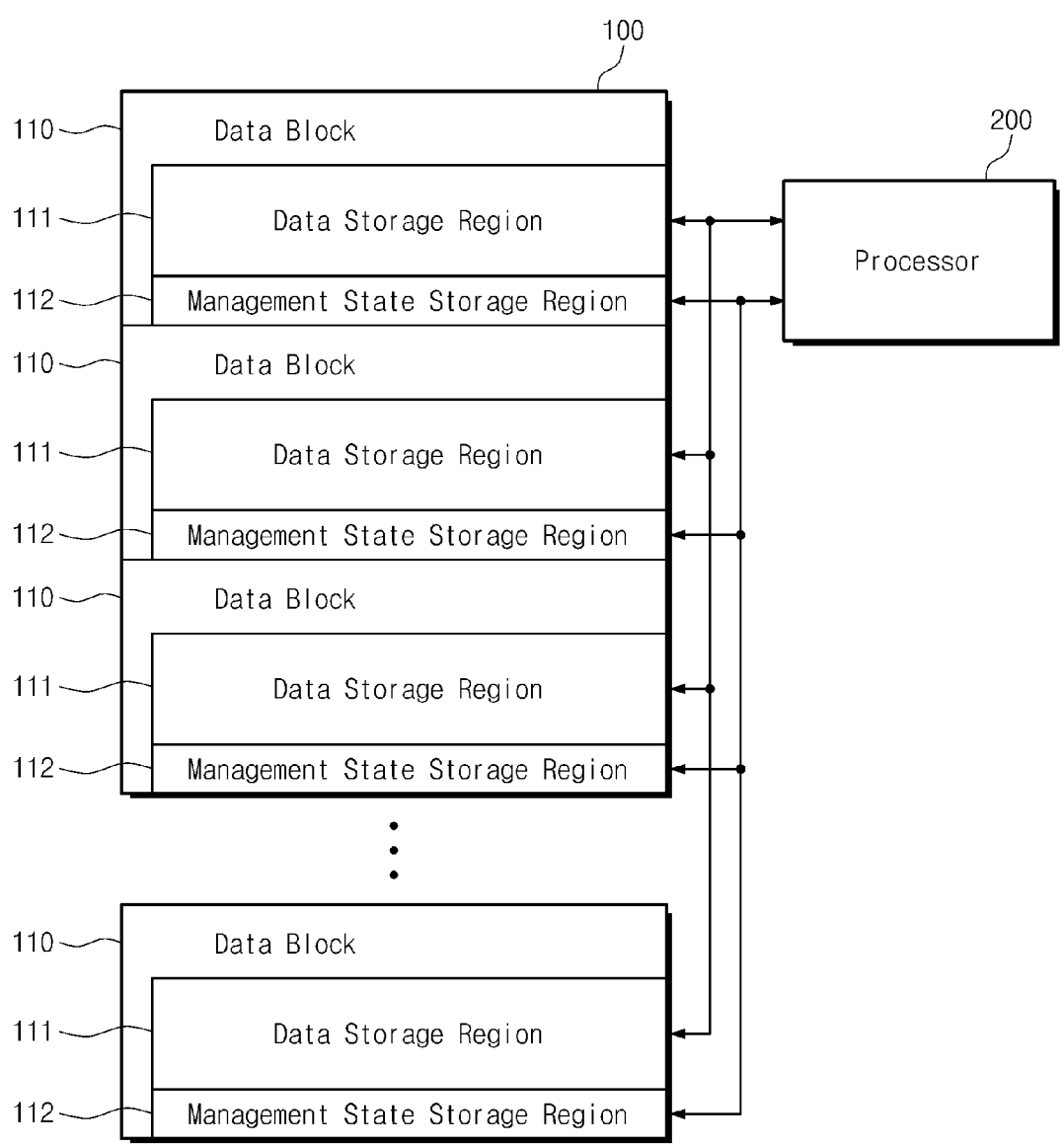
FIG. 5 is a block diagram of a conventional semiconductor memory device.

FIG. 5 is a block diagram illustrating the configuration of a semiconductor memory device disclosed in Japanese '891. Referring to FIG. 5, the semiconductor memory device comprises a flash memory 100 and a processor 200.

Flash memory 100 comprises a plurality of memory blocks 110 each divided into a data storage region 111 and a management state storage region 112. Data storage region 111 stores user data, and management state storage region 112 stores management information for managing data storage region 111, such as address remapping information, an erase count of memory block 110, and an operation state of memory block 110.

Processor 200 performs wear leveling based on the address remapping information and the erase count of memory block 110 in management state storage regions 112. According to Japanese '891, processor 200 determines an erase count of a selected one of memory blocks 110 by accessing a corresponding one of management state storage regions 112. Where the erase count is an invalid value (e.g., because of a power outage during an erase operation), processor 200 determines that memory block 110 is not normally erased and restores the erase count of memory block 110 in management state storage region 112.

In flash memory 100 of Japanese '891, a rewrite process for management information stored in management state storage region 112 is performed at the same time as a rewrite process for data stored in data storage region 111. Consequently, where flash memory 100 loses power during a rewrite processing operation the management information stored in management state storage region 112, the management information is likely to become invalid.

Similarly, erase count information of one of memory blocks 110 can become invalid due to an interruption of a power supply during a rewrite processing operation of the memory block 110. Consequently, it may be difficult to determine whether the memory block 110 is normally erased.

Certain embodiments of the inventive concept address the above and other problems by performing wear leveling in an on-chip environment as described below. In certain embodiments, a semiconductor memory device can determine whether data of a memory block is normally erased even where a power supply is interrupted during an erase operation. In certain embodiments, the semiconductor memory device sets flag information to a first value before an erase operation of a memory block, and sets the flag information to a second value after the erase operation is completed. Where the flag information has the first value, the semiconductor device can detect that an erase operation of the memory block has not been successfully completed, even after an unexpected loss of power has occurred.

Figure 1:
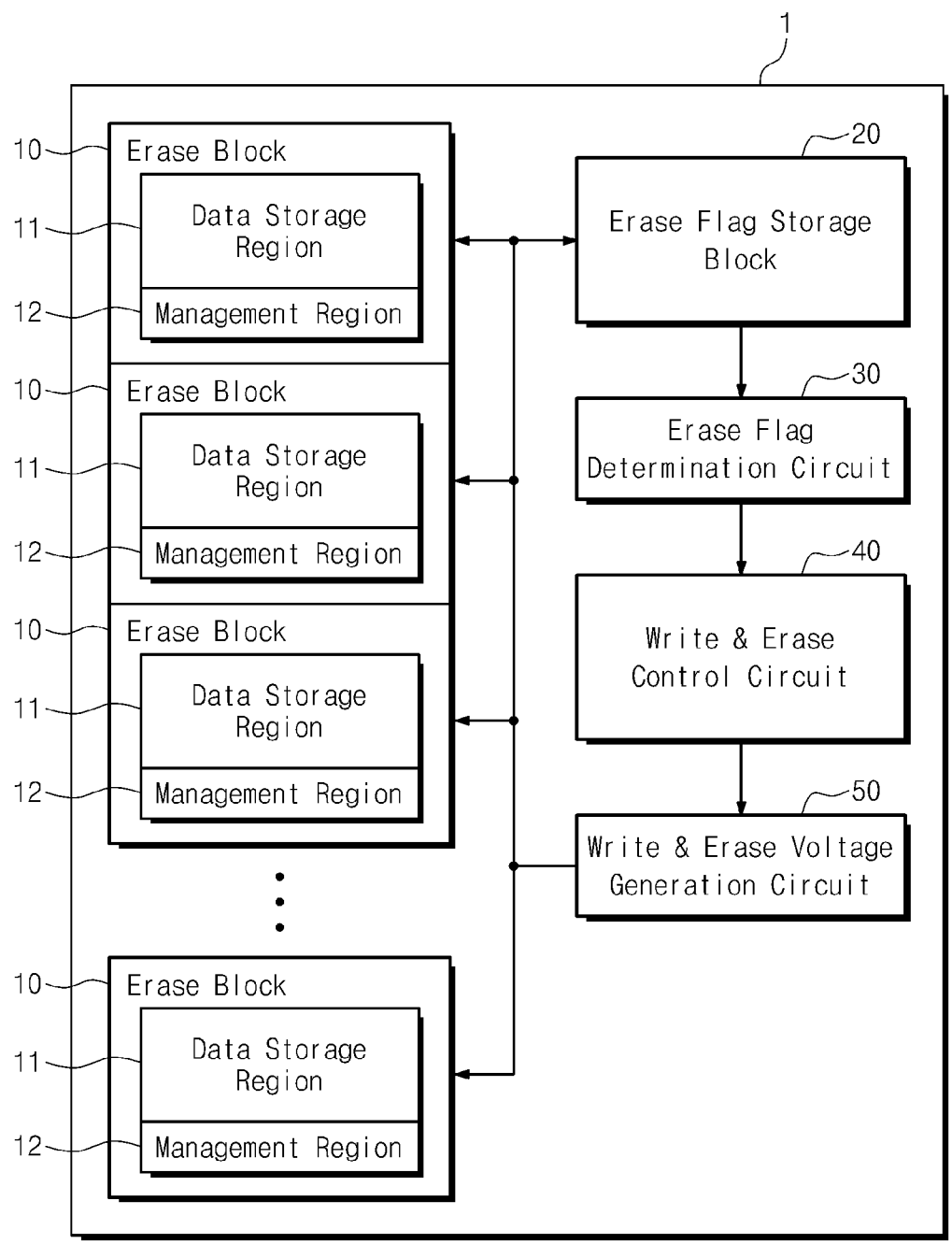
FIG. 1 is a block diagram of a semiconductor memory device according to an embodiment of the inventive concept.

FIG. 1 is a block diagram illustrating the configuration of a semiconductor memory device 1 according to an embodiment of the inventive concept. Referring to FIG. 1, semiconductor memory device 1 comprises a plurality of erase blocks 10, an erase flag storage block, an erase flag determination circuit 30, a write/erase control circuit 40, and a write/erase voltage generation circuit 50.

Each of erase blocks 10 is a memory block comprising a predetermined number of memory cells. Each of erase blocks 10 comprises a data storage region 11 and a management region 12. Each data storage region 11 stores data to be written to semiconductor memory device 1 by a user.

Each management region 12 stores data indicating address remapping or replacement information for performing wear leveling in semiconductor memory device 1, or management information of erase block 10, such as an erase count of erase block 10.

In semiconductor memory device 1, data is erased in units of erase blocks. Accordingly, data storage regions 11 and corresponding management regions 12 are erased at the same time.

Erase flag storage block 20 is a memory block configured to store information regarding erase operations performed by erase blocks 10. For each erase block 10, erase flag storage block 20 stores a flag indicating a state of an erase operation for the erase block 10, and an address of the erase block 10.

Erase flag storage block 20 can be erased in units other than an entire memory block. In addition, erase flag storage block 20 can perform data storage in units of a single bit. A data storage format of erase flag storage block 20 is described in further detail with reference to FIG. 2.

Figure 2:
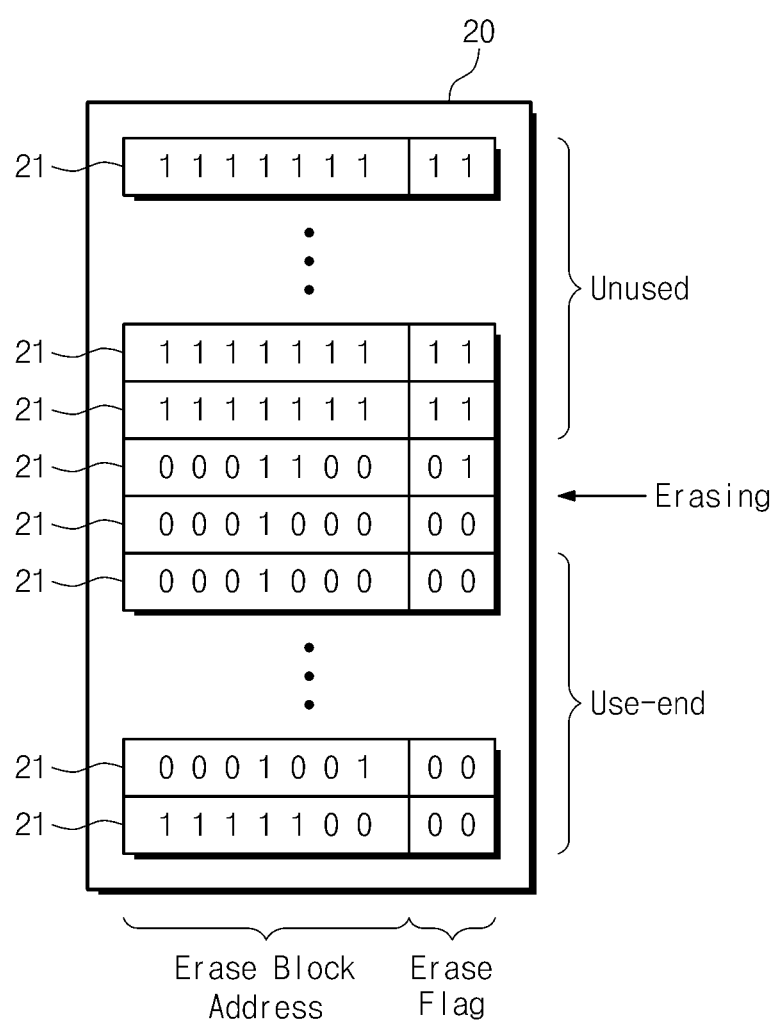
FIG. 2 is a block diagram of an erase flag storage block of a semiconductor memory device according to an embodiment of the inventive concept.

FIG. 2 illustrates an example data storage format of erase flag storage block 20 according to an embodiment of the inventive concept. Referring to FIG. 2, erase flag storage block 20 comprises a plurality of erase operation data regions 21 each adapted to store information regarding an erase operation of an erase block 10. Each erase operation data region 21 has one of three states comprising a USE-END state, an ERASING state, and an UNUSED state. The USE-END state corresponds to erase operations that have been successfully completed, the ERASING state corresponds to erase operations that have been initiated, but not yet completed, and the UNUSED state corresponds to available erase operation data regions 21.

Each of erase operation data regions 21 stores an erase block address corresponding to one of erase blocks 10, and a flag indicating a state of an erase operation of the one of erase blocks 10. Where an erase block address of one of erase blocks 10 is stored in one of erase operation data regions 21, it indicates that an erase operation has been requested for that erase block 10, and the erase operation data region is in the ERASING or USE-END state. Where one of erase operation data region 21 stores an erase block address '1111111', it indicates that the erase operation data region 21 is in the UNUSED state.

The erase flag comprises two bits indicating whether an erase operation data region is in the ERASING state, the USE-END state, or the UNUSED state. The erase flag is '11' in the UNUSED state, '01' in the ERASING state, and '00' in the USE-END state.

The value of the erase flag changes from '11' to '01' in response to a state transition from the UNUSED state to the ERASING state, and from '01' to '00' in response to a state transition from the ERASING state to the USE-END state. In an alternative embodiment, the ERASING state can be indicated by the mere storage of an erase block address in an erase operation data region 21.

In the embodiment of FIG. 2, where an erase flag changes from the UNUSED state to the ERASING state, data '0' is stored in an upper bit of the erase flag. Where the erase flag changes from the ERASING state to the USE-END state, data '0' is stored in a lower bit of the erase flag. In some embodiments, the ERASING state can be expressed by a single '0' in the erase flag.

Erase flag determination circuit 30 determines whether there is an erase block 10 that is being erased, based on values of erase flags stored in respective erase operation data regions 21 of erase flag storage block 20. Where erase flag determination circuit 30 determines that there is an erase block 10 that is being erased, the value of the corresponding erase block address is output from erase flag storage block 20 to write and erase control circuit 40 as a result of the determination.

Erase flag determination circuit 30 monitors the states of erase operation data regions 21 in erase flag storage block 20 and outputs information regarding the monitored states to write and erase control circuit 40. For example, where all of the erase operation data regions 21 are in an USE-END state, erase flag determination circuit 30 outputs information indicating this fact to write and erase control circuit 40.

Write and erase control circuit 40 controls erase and program operations of erase blocks 10 in response to inputs from a user of semiconductor memory device 1. In controlling the erase and program operations, write and erase control circuit 40 also controls wear leveling to control the respective erase counts of erase blocks 10.

In an erase operation of erase block 10, write and erase control circuit 40 performs a control operation to store an erase block address in an erase operation data region 21 having the UNUSED state, or to update a value of an erase flag of the erase operation data region 21 in which address storage is completed.

Write and erase control circuit 40 can also perform a control operation to restore an erase block 10 that is being erased, according to a determination result input from erase flag determination circuit 30. The erase block 10 can be restored by revising an erase count of the erase block 10 in management region 12 of erase block 10 and completing erasure of the erase block 10. After restoring the erase block 10, an operation is performed to change the corresponding erase flag to '00' in erase flag storage block 20.

Write and erase control circuit 40 can also perform a control operation to erase data from erase flag storage block 20 where all erase operation data regions 21 in erase flag storage block 20 are in the USE-END state.

Write and erase control circuit 40 can perform control operations by outputting commands to write and erase voltage generation circuit 50. In response to these commands, write and erase voltage generation circuit 50 generates voltages for storing or erasing data in memory cells. The memory cells can comprise, for instance, portions of data storage regions 11, management regions 12, or erase operation data regions 21.

Figure 3:
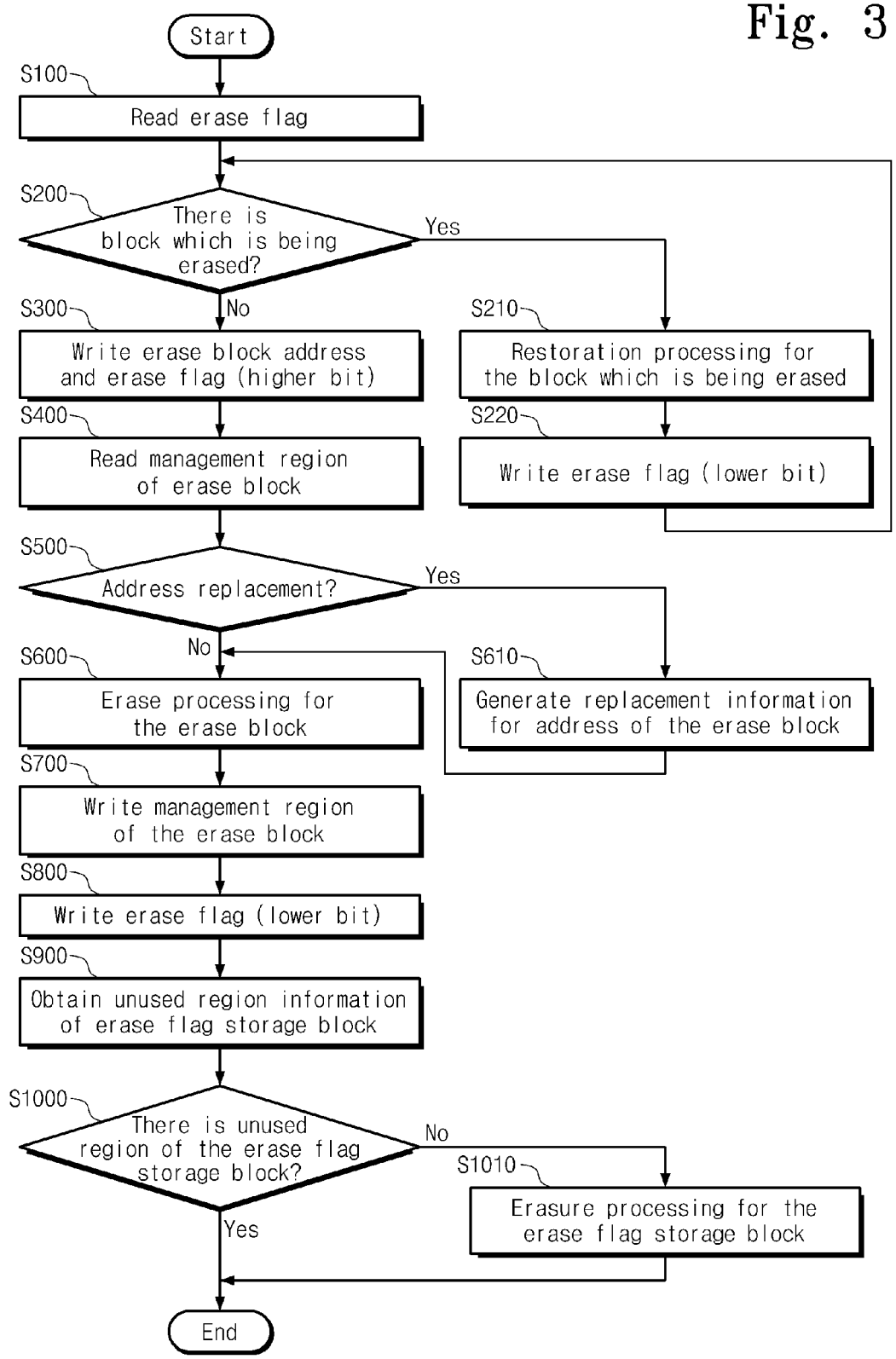
FIG. 3 is a flowchart illustrating a method of managing data in an erase flag storage block during an erase operation of a semiconductor memory device according to an embodiment of the inventive concept.

FIG. 3 is a flowchart illustrating a method of managing data in erase flag storage block 20 during an erase operation of semiconductor memory device 1 according to an embodiment of the inventive concept. In the description that follows, it will be assumed that data is stored in data storage region 11 of semiconductor memory device 1 using conventional programming methods. In addition, example method steps will be indicated by parentheses (SXXX).

In an erase operation of data storage region 11, erase flag determination circuit 30 reads an erase flag from each erase operation data region 21 of erase flag storage block 20 (S100).

Thereafter, erase flag determination circuit 30 determines whether there is an erase block 10 which is being erased, based on a value of the read erase flags (S200). Accordingly, erase flag determination circuit 30 can determine whether a power supply of semiconductor memory device 1 has been cut off during an erase operation of erase block 10, and whether there is an erase block 10 having invalid management information in its management region 12. The above determinations can be made, for instance, by detecting an erase operation data region 21 having the ERASING state.

Where there is no erase operation data region 21 in the ERASING state (S200=No), erase flag determination circuit 30 determines that erase operations of all erase blocks 10 have been normally completed, and the method proceeds to step S300. Otherwise (S200=Yes), erase flag determination circuit 30 determines whether there is invalid management information in the management region 12 corresponding to the erase operation data region 21 in the ERASING state, and outputs a corresponding erase block address to write and erase control circuit 40. Erase control circuit 40 then outputs an instruction to write and erase voltage generation circuit 50 to perform a restoration process on the erase block 10 corresponding to the identified erase operation data region 21 (S210).

In response to the instruction from erase control circuit 40, write and erase voltage generation circuit 50 erases data from memory cells of data storage region 11 and management region 12 in the erase block 10 and stores data in the memory cell and management region 12 to indicate completion of the erase operation. Thus, the data storage region 11 is normally erased and management region 12 is restored to a normal state.

Write and erase control circuit 40 also outputs an instruction to write and erase voltage generation circuit 50 to update a value of an erase flag of the erase operation data region 21 storing an erase block address of the restored erase block 10 (S220). In response to this instruction, write and erase voltage generation circuit 50 updates the value of the erase flag of the erase operation data region 21. In particular, the erase flag can be updated from the ERASING state to the USE-END state by writing a '0' into a lower bit of the erase flag. Following step S200, the method returns to step S200.

In step S300, write and erase control circuit 40 outputs an instruction to write and erase voltage generation circuit 50 to store an erase block address in a selected erase operation data region 21 to indicate a pending erase operation of a selected erase block 10. Write and erase control circuit 40 also outputs an instruction to write and erase voltage generation circuit 50 to modify the erase flag the selected erase operation data region 21. Write and erase voltage generation circuit 50 then performs operations according to the instructions from write and erase control circuit 40. In particular, write and erase voltage generation circuit 50 changes the erase flag of the selected erase operation data region 21 to the ERASING state by writing a '0' into an upper bit of the erase flag (S300).

Next, write and erase control circuit 40 reads management information stored in the management region 12 of the selected erase block 10 (S400). Moreover, write and erase control circuit 40 determines whether there is a requirement for address replacement according to wear leveling control based on the management information (S500). This determination can be accomplished by detecting whether an incremented erase count of the selected erase block 10, based on the pending erase operation, would exceed a threshold amount, such as a predetermined maximum value, or a maximum value relative to other erase blocks 10. Where the incremented erase count would not exceed the threshold amount, write and erase control circuit 40 determines that there is no requirement for address replacement. Otherwise, write and erase control circuit 40 determines that there is a requirement for address replacement.

Where there is a requirement for address replacement (S500=Yes), the method proceeds to S610. In step S610, replacement information is generated for the address of the selected erase block 10, and the method proceeds to step S600. The replacement information can comprise, for instance, new logical addresses for the selected erase block 10 and corresponding data. The reassignment of logical addresses can be used to reorganize physical data storage in semiconductor memory device 1 so that wear leveling operations can be performed. Where there is no requirement for address replacement at the S500 (S500=No), the method proceeds to step S600.

In step S500, the erase count of the selected erase block 10 is updated to reflect the current erase operation irrespective of whether address replacement is to be performed.

Following step S500, write and erase control circuit 40 outputs an instruction to write and erase voltage generation circuit 50 to perform erase processing on the selected erase block 10 (S600). In response to the instruction, write and erase voltage generation circuit 50 performs an erase operation on the selected erase block 10, including the management region 12 of the selected erase block 10.

Next, write and erase control circuit 40 outputs an instruction to write and erase voltage generation circuit 50 to store new management information in the management region 12 of the selected erase block 10 (S700). The new management information comprises updated data reflecting an incremented erase count of the selected erase block 10 and any address replacement information, such as a new logical block address. Write and erase voltage generation circuit 50 then performs operations according to the instruction.

Thereafter, write and erase control circuit 40 outputs an instruction to write and erase voltage generation circuit 50 to update a value of the erase flag of the erase operation data region 21 storing the erase block address of the selected erase block 10 (S800). Write and erase voltage generation circuit 50 performs operations to update the erase flag according to the instruction. Upon successful erasure of the selected memory block 10, the erase flag is updated to the USE-END by writing a '0' into a lower bit of the erase flag.

Next, write and erase control circuit 40 obtains information from erase flag determination circuit 30 regarding an unused region of erase flag storage block 20 (S900).

Write and erase control circuit 40 determines whether there is an unused region, i.e., an unused erase operation data region 21 in erase flag storage block 20, based on the obtained information on the unused region of erase flag storage block 20 (S1000). This determination is performed to secure an erase operation data region 21 for a next erase operation of semiconductor memory device 1.

Where there is no unused region of erase flag storage block 20 (S1000=No), write and erase control circuit 40 determines that erasure of data of erase flag storage block 20 is required, and the method proceeds to step S1010.

On the other hand, where there is an unused region in erase flag storage block 20 (S1000=Yes), write and erase control circuit 40 determines that erasure of data of erase flag storage block 20 is not required and the method ends.

In step S1010, write and erase control circuit 40 outputs an instruction to write sand erase voltage generation circuit 50 to erase the data of erase flag storage block 20 (S1010). Write and erase voltage generation circuit 50 then performs operations according to the instruction. Consequently, data in all erase operation data regions 21 of erase flag storage block 20 are erased so that each erase operation data region 21 stores erase block address '1111111' and erase flag '11'.

Figure 4:
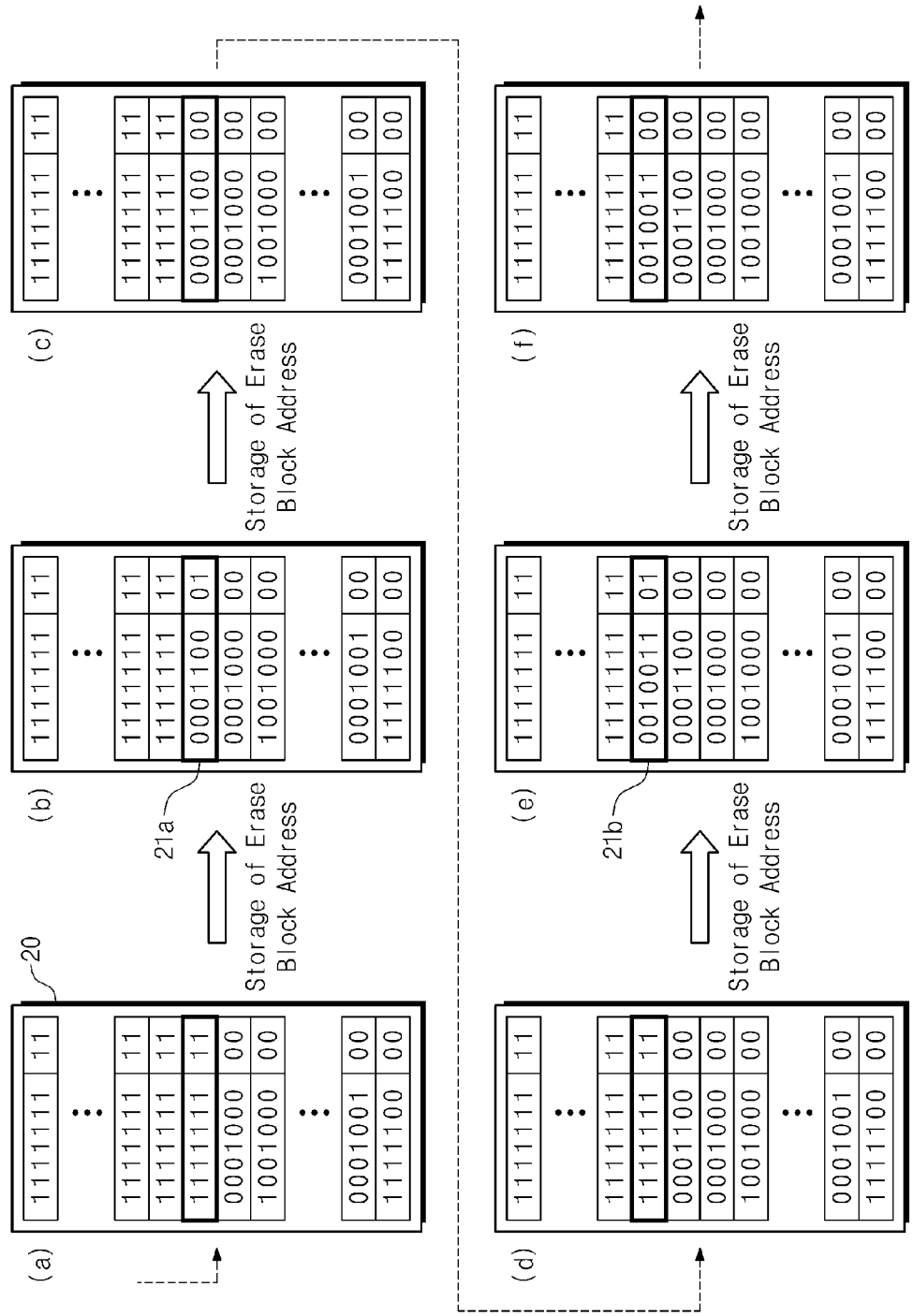
FIG. 4 is a diagram illustrating data transitions of an erase flag storage block during an erase operation of a semiconductor memory device according to an embodiment of the inventive concept.

FIG. 4 illustrates data transitions of erase flag storage block 20 during an erase operation of semiconductor memory device 1 according to an embodiment of the inventive concept.

FIG. 4(a) illustrates erase flag storage block 20 in a state where prior erase operations have been successfully completed. Thus, in FIG. 4(a), none of the erase flags have the value '01'.

FIG. 4(b) illustrates erase storage block 20 after an erase operation has been initiated on a selected erase block 10 in response to a request by a user of semiconductor memory device 1. In FIG. 4(b), data '0' is stored in an upper bit of an erase flag of an unused erase operation data region 21a, and an erase block address '0001100' of the selected erase block 10 is stored in the erase operation data region 21a (see step S300 of FIG. 3). Accordingly, the erase operation data region 21a assumes the ERASING state.

FIG. 4(c) illustrates erase storage block 20 after the erase operation has been completed on the selected erase block 10. In FIG. 4(c), data '0' is stored in a lower bit of the erase flag of erase operation data region 21a (see step S800 of FIG. 3). Thus erase operation data region 21a assumes the USE-END state.

FIG. 4(d) illustrates a state of erase storage block 20 after the operations of FIGS. 4(a) through 4(c). In FIG. 4(d), another erase operation is initiated by a user of semiconductor memory device 1. In this erase operation, data '0' is stored in any one of 2 bits of an erase flag in an unused erase operation data region 21b; at the same time, an erase block address '0010011' is stored in erase operation data region 21b (See FIG. 4(e)). Thus the erase operation data region 21b assumes the ERASED state. Thereafter, an erase operation is performed on the erase block 10 at erase block address '0010011' and the erase flag of erase operation data region 21b is updated to reflect the completion of the erase operation (See FIG. 4(f)).

As indicated by the description of FIGS. 1 through 4, erase flag storage block 20 stores erase flags for erase blocks 10 at a region that is different from management regions 12 of erase blocks 10. The erase flags in erase flag storage block 20 do not become invalid where a power supply is cut off during an erase operation of a selected erase block 10. Accordingly, where the power supply is resumed, the erase flag of the selected erase block 10 can be inspected to determine whether it has been successfully erased. Based on the inspection of the erase flag, a restoration process can be performed on the management information of the selected erase block 10. The restoration process can ensure that accurate information is available for operations such as wear leveling and erase count monitoring.

As long as there is an unused erase operation data region 21 in erase flag storage block 20, erase flag storage block 20 is not erased. Accordingly, the erase count of erase flag storage block 20 can be minimized, thereby extending the lifetime of erase storage block 20.

In some embodiments, erase flag storage block 20 is designed to have a number of regions based on the number of erase blocks 10, and the erase count of erase blocks 10. In particular, erase flag storage block 20 can be designed with sufficient regions so that it does not wear out before erase blocks 10. For example, in the embodiment of FIG. 3, suppose that semiconductor memory device 1 comprises five erase blocks 10 each having a maximum erase count of 10, and erase flag storage block 20 is designed with five erase operation data regions 21 and a maximum erase count of 10. In this case, whenever an erase operation is performed on one of the five erase blocks 10, an erase block address and an erase flag are stored in an unused erase operation data region 21 of erase flag storage block 20 (S300). Accordingly, erase flag storage block 20 is only erased after five erase operations have been performed on erase blocks 10 of semiconductor memory device 1. Moreover, because wear leveling is performed in semiconductor memory device 1, erase flag storage block 20 is only erased after each of the five erase blocks 10 is erased once.

Erase flag storage block 20 is erased after repeated erase operations of erase blocks 10 (S1000). The timing for erasing erase flag storage block 20 is in multiples of five erase operations of erase blocks 10. In other words, erase flag storage block 20 is erased one time for every five erasures of an erase block 10. Accordingly, after ten erase operations of each of erase blocks 10, the total number of erase operations of erase blocks 10 is 50, and the erase count of erase flag storage block 20 is 10.

In certain embodiments, erase flag storage block 20 is designed so that the number of erase operation data storage regions 21 is equal to the number of erase blocks 10. With this design, the total number of erase counts of erase blocks 10 can reach a maximum value before the erase count of erase flag storage block 20 reaches a maximum value. As a result, erase flag storage block 20 can continue to track erase operations of erase blocks 10 for the entire lifetime of the memory blocks 10.

In the method of FIG. 3, semiconductor memory device 1 reads an erase flag before an erase operation to determine whether an erase block 10 is being erased (S100 and S200). However, semiconductor memory device 1 can also determine whether an erase block 10 is being erased after a power supply to semiconductor memory device 1 is cut off. In this case, where the power is restored to semiconductor memory device 1, semiconductor memory device 1 can perform steps S100 and S200, followed by steps S210 and S220. Thereafter, the method of FIG. 3 can resume at step S300 to conduct an erase operation on one of erase blocks 10.

In the method of FIG. 3, semiconductor memory device 1 determines whether there is an unused region of erase flag storage block 20 after completing an erase operation (S900 through S1010). However, semiconductor memory device 1 can also determine whether there is an unused region of erase flag storage block 20 upon initiation of a next erase operation by a user of semiconductor memory device 1. In this case, steps S900 through S1010 can be performed before step S300 of FIG. 3.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A semiconductor memory device comprising a plurality of memory blocks arranged in a single chip, the semiconductor memory device comprising:
   a wear leveling unit that stores management information comprising an erase count of one or more of the plurality of memory blocks;
   an information storage unit that stores address information of a selected memory block among the plurality of memory blocks, and further stores an erase flag indicating whether an erase operation of the selected memory block has been initiated or completed;
   a setting unit that sets the address information of the selected memory block in the information storage unit upon initiation of the erase operation, sets the erase flag to a first value upon initiation of the erase operation, and sets the erase flag to a second value upon completion of the erase operation; and
   a determination unit that determines whether the erase operation has been completed based on erase flag information stored in an erase flag storage block within a flash memory.

2. The semiconductor memory device of claim 1, wherein the setting unit sets the erase flag to the first value by programming a single bit of the erase flag storage block.

3. The semiconductor memory device of claim 1, wherein, before the erase operation of the selected memory block, the determination unit determines whether all previously initiated erase operations of the plurality of memory blocks have been completed, based on the erase flag information.

4. The semiconductor memory device of claim 1, wherein, following a power loss and a subsequent power restoration of the semiconductor memory device, the determination unit determines whether erase operations of the memory blocks that were initiated before the power loss have been completed, based on the erase flag information.

5. The semiconductor memory device of claim 1, wherein the erase flag of the selected memory block comprises two bits of data, wherein a first one of the two bits is programmed to indicate that an erase operation is being performed on the selected memory block, and a second one of the two bits is programmed to indicate that the erase operation of the selected memory block is completed.

6. The semiconductor memory device of claim 1, wherein the wear leveling unit, the information storage unit, the setting unit, and the determination unit are located in the single chip.

7. The semiconductor memory device of claim 1, wherein each of the plurality of memory blocks comprises a NAND flash memory block.

8. The semiconductor memory device of claim 1, wherein the erase flag storage block comprises a memory block within the flash memory.

9. A method performed by a semiconductor memory device comprising a plurality of memory blocks, a wear leveling unit that stores erase counts of the memory blocks, and an erase flag storage block that stores block address information of the memory blocks and erase flag information indicating erase operation states of the memory blocks, the method comprising:
   reading an erase flag from the erase flag storage block within a flash memory, in response to an erase command;
   determining whether any previously initiated erase operation remains incomplete, according to the erase flag; and
   upon determining that no previously initiated erase operation remains incomplete, (a) storing in the erase flag storage block an erase block address of a selected memory block to be erased, and programming an upper bit of the erase flag, (b) reading management information stored in a management region of the selected memory block to determine whether to perform address replacement on the selected memory block, (c) upon determining to perform address replacement on the selected memory block, generating address replacement information for the selected memory block, (d) performing an erase operation on the selected memory block according to the erase command, (e) generating a new management region for the selected memory block, (f) programming a lower bit of the erase flag following completion of the erase operation, and (g) obtaining information to identify any unused erase operation data regions of the erase flag storage block.

10. The method of claim 9, further comprising:
    upon determining that a previously initiated erase operation remains incomplete, performing a restoration process on a memory block for which the erase operation was initiated.

11. The method of claim 10, further comprising:
    programming a lower bit of the erase flag upon completing the restoration process.

12. The method of claim 9, further comprising:
    designating a number of erase operation data regions for the erase flag storage block according to a number of memory blocks in the semiconductor memory device, and erase endurance parameters of the memory blocks.

13. The method of claim 9, further comprising:
    performing an erase process of the erase flag storage block when there is no unused region of the erase flag storage block.

14. The method of claim 9, wherein the erase flag storage block comprises a nonvolatile memory block of the flash memory located on a single chip, and wherein the erase flag storage block is programmed in different sized units than other ones of the plurality of memory blocks.

15. A semiconductor memory device, comprising:
    a plurality of memory blocks;
    an erase flag storage block storing block address information of the respective memory blocks, and flag information indicating erase operation states of the respective memory blocks, the erase flag storage block is within a flash memory; and
    a wear leveling unit storing management information on erase counts of the respective memory blocks and configured to control the management information for wear leveling operations of the memory blocks,
    wherein the flag information indicates whether the memory blocks are successfully erased during erase operations, and
    wherein the flag information comprises at least one bit indicating initiation of an erase operation and at least one bit indicating a completion state of an erase operation corresponding to an erase instruction.

16. The semiconductor memory device of claim 15, wherein the memory blocks and the erase flag storage block are erased in different sized erase units.

17. The semiconductor memory device of claim 15, further comprising:

an erase flag determination circuit determining a use state of an erase operation data region in the erase flag storage block.

18. The semiconductor memory device of claim 17, wherein the erase flag determination circuit determines whether an erase operation of one of the memory blocks has been interrupted based on the use state.

19. The semiconductor memory device of claim 18, wherein the one of the memory blocks is re-erased upon determining that the erase operation has been interrupted.

* * * * *